(12) United States Patent
Ichino et al.

(10) Patent No.: US 7,299,394 B2
(45) Date of Patent: Nov. 20, 2007

(54) METHOD AND APPARATUS FOR DETERMINING OPTIMUM INITIAL VALUE FOR TEST PATTERN GENERATOR

(75) Inventors: Ken-ichi Ichino, Tokyo (JP); Masayuki Arai, Tama (JP); Satoshi Fukumoto, Kawasaki (JP); Kazuhiko Iwasaki, Yokohama (JP); Takeshi Shoda, Kokubunji (JP); Masayuki Sato, Takasaki (JP)

(73) Assignee: Semiconductor Technology Academic Research Center, Yokohama (JP)

( * ) Notice: Subject to any disclaimer, the term of this patent is extended or adjusted under 35 U.S.C. 154(b) by 1138 days.

(21) Appl. No.: 10/400,911

(22) Filed: Mar. 28, 2003

(65) Prior Publication Data

US 2004/0088626 A1 May 6, 2004

(30) Foreign Application Priority Data

Sep. 11, 2002 (JP) ............................. 2002-265519

(51) Int. Cl.
*G01R 31/28* (2006.01)
(52) U.S. Cl. .................. 714/738; 714/739; 714/741
(58) Field of Classification Search ................ 714/738, 714/739, 741
See application file for complete search history.

(56) References Cited

U.S. PATENT DOCUMENTS

| | | | |
|---|---|---|---|
| 5,991,909 A | 11/1999 | Rajski et al. | ................ 714/729 |
| 6,766,473 B2 | 7/2004 | Nozuyama | ................ 714/33 |
| 7,162,674 B2 | 1/2007 | Nozuyama | ................ 714/741 |
| 7,178,078 B2 | 2/2007 | Hiraide et al. | ............... 714/739 |

OTHER PUBLICATIONS

Kapur, Robit, et al., "Design of an Efficient Weighted Random Pattern Generation System", International Test Conference 1994, pp. 491-500.
Tsai, Huan-Chih, et al. "Improving the Test Quality for Scan-Based BIST Using a General Test Application Scheme", DA Conference 1999, pp. 748-753.
Kiefer, Gundolf, et al., "Deterministic BIST with Multiple Scan Chains", International Test Conference 1998, pp. 1057-1064.
Keifer, Gundolf, et al., "Application of Determinstic Logic BIST on Industrial Circuits", International Test Conference 2000, pp. 105-114.

(Continued)

*Primary Examiner*—James C. Kerveros
(74) *Attorney, Agent, or Firm*—Staas & Halsey LLP

(57) ABSTRACT

The purpose of the invention is to determine an optimum initial value to be input to a test pattern generator in order to achieve efficient testing of an integrated circuit. To achieve this purpose, a minimum test length is obtained by performing a fault simulation and a reverse-order fault simulation using an arbitrarily given initial value; the next initial value that is likely to yield a test length shorter than the minimum test length is computed and a fault simulation is performed using the thus computed initial value; and the next initial value that is likely to yield a test length shorter than that test length is computed and a fault simulation is performed using the thus computed initial value. By repeating this process, an initial value that yields the shortest test length is obtained.

18 Claims, 14 Drawing Sheets

OTHER PUBLICATIONS

Das, Debaleena, et al., "Reducing Test Data Volume Using External/LBIST Hybrid Test Patterns", International Test Conference 2000, pp. 115-122.

Hellebrand, Sybille, "Generation of Vector Patterns Through Reseeding of Multiple-Polynomial Linear Feedback Shift Registers", International Test Conference 1992, pp. 120-129.

Bayraktaroglu, Ismet, et al., "An Examination of PRPG Selection Approaches for Large, Industrial Designs", Asia Test Symposium 1998, pp. 440-444.

Bayraktaroglu, Ismet, et al., "Selecting PRPG: Randomness, Primitiveness, or Sheer Luck?", Asia Test Symposium 2001, pp. 373-378.

Fagot, C., "A Ring Architecture Strategy for BIST Test Pattern Generation", Asia Test Symposium 1998, pp. 418-423.

Fagot, C., "On Calculating Efficient LFSR Seeds for Built-In Self Test", Europe Test Conference 1999, pp. 4-14.

Fig.7

```
procedure SEARCH_ISTAR
begin
    i := 0;
    l := L(α^i, n_fix);
    while( i < 2^n - 1 ) do
    begin
        l_min  := L_R(α^{i+l-1}, n_fix);
        i_min  := i + l - l_min;
        i      := i_min + 1;
        l      := L(α^i, n_fix);
        repeat
            i := i + l - l_min + 1;
            l := L(α^i, n_fix)
        until( l = l_min - 1 and i < 2^n - 1 )
    end;
    l* := L_min;
    i* := i_min
end.
```

Fig.12

```
procedure SEARCH_JSTAR
begin
  j := 0;
  repeat
    repeat
      n_t   := N(β_j, l_fix);
      l_min := L_R(β_{i+L_fix -1}, n_t);
      j     := j + l_fix - l_min;
      j_min := j;
      j     := j + 1;
      l     := L(β_j, n_t)
    until( l < l_fix  and  j < 2^n - 1 );
    repeat
      j := j + l - l_fix + 1;
      l := L(β_j, n_t)
    until( l > l_fix - 1  and  j < 2^n - 1)
  until( j < 2^n - 1 );
  n* := n_t;
  j* := j_min
end.
```

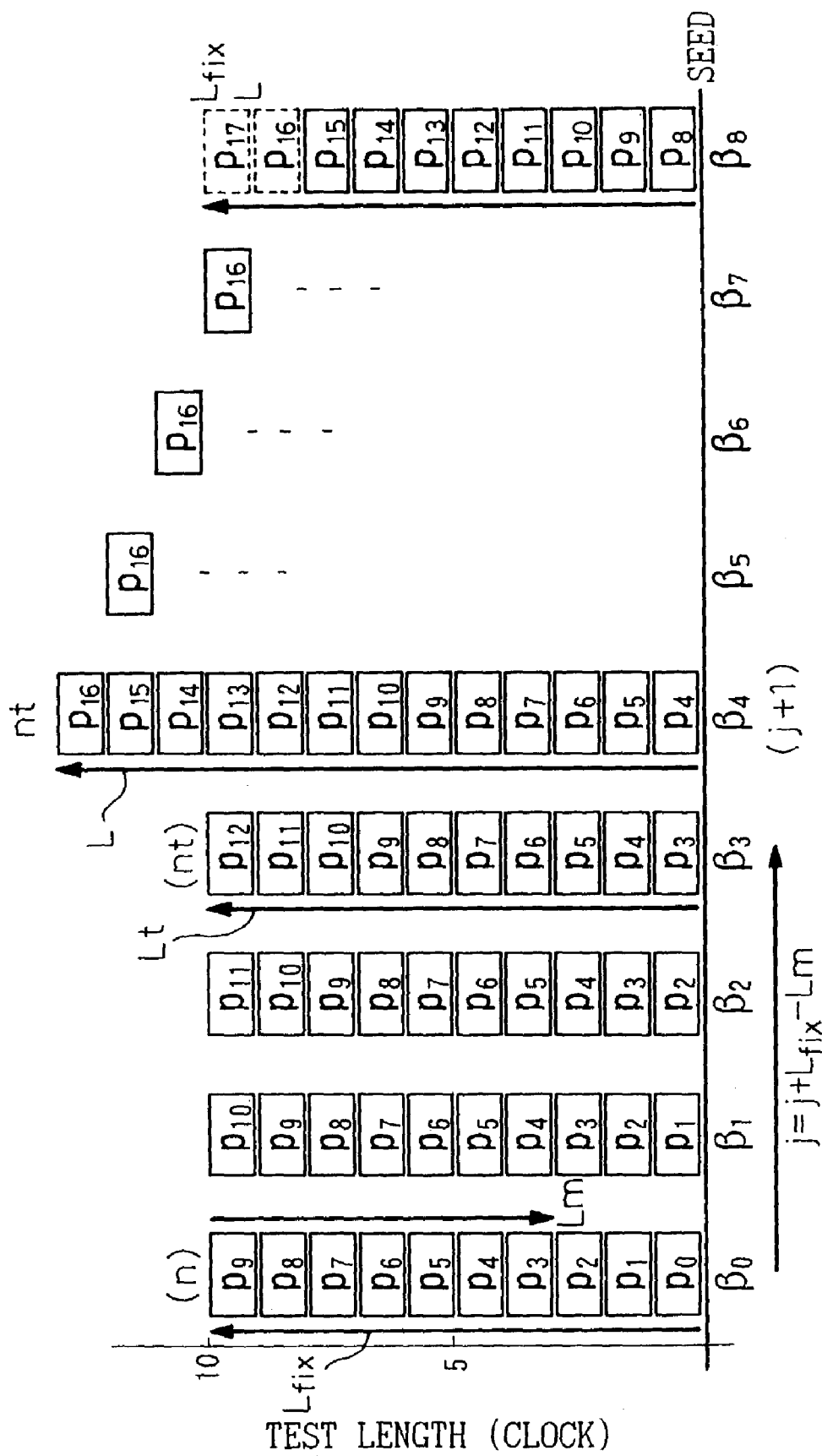

METHOD AND APPARATUS FOR DETERMINING OPTIMUM INITIAL VALUE FOR TEST PATTERN GENERATOR

CROSS-REFERENCE TO RELATED APPLICATION

This application claims priority from Japanese Patent Application No. 2002-265519, filed on Sep. 11, 2002.

BACKGROUND OF THE INVENTION

1. Field of the Invention

The present invention relates to a method for determining an optimum initial value for efficient testing of an integrated circuit, including a large scale integrated circuit (VLSI), in a test pattern generator that generates a test pattern to be applied to the circuit under test.

2. Prior Art

With the increasing miniaturization of semiconductor processes, the costs of testing integrated circuits (including LSIs and VLSIs) have been increasing. If the operating speeds and integration levels of LSIs continue to increase at the present pace, more expensive testers than those used today would have to be used, over a long period of time, for LSI testing. To reduce test times on such expensive testers, extensive research has been conducted to find designs for easing the burden on testers by using design-for-testability techniques exemplified by scan design and built-in self-test (BIST) techniques.

BIST implements testing by integrating a test pattern generator (TPG) and a test response compactor (TRC) on the same chip as the circuit to be tested. This serves to ease the burden on the tester connected externally to the chip. A linear feedback shift register (LFSR) and a multiple input signature register (MISR) are often used as the TPG and the TRC, respectively.

A pseudo-random test pattern generator that uses an LFSR can apply a test pattern without using a tester, but has the shortcoming that, to achieve a high fault coverage exceeding 95%, a large number of test patterns become necessary and, as a result, the time required for testing, i.e., the test length, increases. Many attempts to overcome this shortcoming have been reported. One such attempt is a weighted pseudo-random sequence generating technique which assigns a weight to each bit in the test pattern to be applied to the circuit under test (hereinafter referred to as the CUT), and changes the probability of each bit being a 1 or a 0 in order to improve fault detection probability. (Refer, for example, to Literature 1 listed below.)

On the other hand, a method that inserts observation points and test points is intended to improve test quality by including the observation points and test points in the circuit under test and thereby improve the observability and controllability. However, as this method inserts observation points and test points in the CUT, the shortcoming is that the circuit structure of the CUT is changed and, hence, delay characteristics, etc. change. (Refer, for example, to Literature 2 listed below.)

With the above techniques alone, it is difficult to obtain sufficient fault coverage with limited test length. Therefore, BIST techniques that combine a random sequence with ATPG (Automatic Test-Pattern Generation) vectors are also being studied. (Refer, for example, to Literature 3, 4, and 5 listed below.)

There is also being studied a method that encodes a testcube as a seed for an LFSR by making use of the don't cares in the test code, and that performs testing by decoding the seed with the LFSR within the chip. In this reseeding method, each testcube is encoded by using an LFSR having a bit length equal to (the number of specified bits in the testcube+20) bits.

There is also a method called MP-LFSR which uses an LFSR having a plurality of feedback polynomials for testcube decoding. In this method, each testcube is encoded by using an MP-LFSR having a bit length equal to (the number of specified bits in the testcube+4) bits. (Refer, for example, to Literature 6 listed below.)

Bit-flipping BIST and bit-fixing BIST are each a method that finds a test pattern closest to the testcube from among the test patterns output from an LFSR, and applies the testcube by flipping or fixing some bits. These methods require a circuit for flipping or fixing bits.

According to the BIST techniques using the reseeding method, bit-flipping BIST, or bit-fixing BIST, first, easily detectable faults are detected using pseudo-random tests, and then reseeding of ATPG vectors is performed. These methods, first, perform pseudo-random tests using about 10,000 patterns. Then, ATPG vectors are applied to the remaining faults that have not been detected by the pseudo-random tests. To add the test vectors, the ATPG vectors must be applied from a tester or, in the case of BIST, a ROM, and if the number of undetected faults is large, the test cost increases.

To reduce the amount of hardware in the bit-flipping BIST or bit-fixing BIST circuitry, it is desirable to improve the quality of pseudo-random testing and thereby reduce the number of undetected faults. When the number of undetected faults is reduced, the tester storage capacity required can be reduced in the case of using a tester, and the internal ROM size can be reduced in the case of BIST.

One possible approach to improving the quality of pseudo-random testing is to improve the quality of pseudo-random testing by carefully selecting the seed. A method that makes use of a preobtained testcube is being studied. This method evaluates the test quality of the seed by the Hamming distance between the test pattern output from the LFSR and the testcube. By so doing, a seed of high test quality can be obtained with a reasonable amount of computation. (Refer, for example, to Literature 7 to 10 listed below.)

(Literature 1)

R. Kapur, S. Patil, T. J. Snethen, T, W. Williams, "Design of an Efficient Weighted Pattern Generation System," Int'l Test Conf., pp. 491-500, 1994

(Literature 2)

H-C. Tsai, K-T. Cheng, S. Bhawmik, "Improving the Test Quality for Scan-based BIST Using a General Test Application Scheme," DA Conf., pp. 748-753, 1999

(Literature 3)

G. Kiefer and H-J. Wunderlich, "Deterministic BIST with Scan Chains," Int'l Test Conf., pp. 1057-1064, (Literature 4)

G. Kiefer, H. Vranken, E. J. Marinissen, H-J. Wunderlich, "Application of Deterministic Logic BIST to Industrial Circuits," Int'l Test Conf., pp. 105-114, 2000

(Literature 5)

D. Das, N. A. Touba, "Reducing Test Data Volume Using External/LBIST Hybrid Test Patterns," Int'l Test Conf., pp. 115-122, 2000

(Literature 6)

S. Hellebrand, S. Tarnick, J. Rajski, B. Courtois, "Generation of Vector Patterns Through Reseeding of Multiple-Polynomial Linear Feedback Shift Registers," Int'l Test Conf., pp. 120-129, 1992

(Literature 7)

I. Bayraktaroglu, K. Udawatta, A. Oraologlu, "An Examination of PRPG Selection Approaches for Large Industrial Design," Asia Test Symposium, pp. 440-444, 1998

(Literature 8)

I. Bayraktaroglu and A. Oraologlu, "Selecting a PRPG, Randomness, Primitiveness, or Sheer Luck?," Asia Test Symposium, pp. 373-379, 2001

(Literature 9)

C. Fagot, O. Gascuel, P. Girard, C. Landrault, "A Ring Architecture Strategy for BIST Test Pattern Generation," Asia Test Symposium, pp. 418-423, 1998

(Literature 10)

C. Fagot, O. Gascuel, P. Girard, C. Landrault, "On Calculating Efficient LFSR Seeds for Built-in Self Test," Europe Test Conf., pp. 4-14, 1999

In the above integrated circuit testing methods using an LFSR, etc. as the test pattern generator, it is known that the test length required to achieve prescribed fault coverage differs if the initial value given to the test pattern generator differs. Accordingly, if the initial value that minimizes the test time can be selected in advance, the test time required in the mass production of integrated circuits can be reduced, and a drastic reduction in test cost can thus be achieved.

In the prior art, however, little attention has been paid to the initial value of the pattern generator, and a suitable value, such as 111 . . . 1 (all 1s), has simply been selected. As a result, if such an initial value, selected without paying any special consideration, is an inappropriate one, there is the possibility that the test length becomes enormously long.

SUMMARY OF THE INVENTION

The present invention has been devised in view of the above problem and proposes, for a test pattern generator, a method for selecting an initial value to be given to the test pattern generator so as to achieve the target fault coverage with the shortest test length. When the method of the invention is used, the test time can be reduced without increasing the amount of chip hardware, though off-line computation time is required for the computation of the initial value.

The invention further proposes a method for selecting a test pattern initial value that achieves a maximum fault detection count for a fixed test length. This means reducing the number of undetected faults. When the method of the invention is used, the number of undetected faults can be reduced without adding extra hardware, though off-line computation time is required. When using a bit-flipping method, the amount of hardware overhead can be reduced.

To solve the above-described problem, the present invention provides a method for determining an optimum initial value to be input to a test pattern generator for testing an integrated circuit, comprising the steps of: a) obtaining a first test length and a first minimum test length for detecting a predetermined number, n, of faults, by performing a fault simulation and a reverse-order fault simulation using an arbitrarily given first initial value; b) computing, based on the first initial value and on the first test length and the first minimum test length, a second initial value that can yield a test length shorter than the first minimum test length; c) obtaining a second test length for detecting the number, n, of faults, by performing a second fault simulation using the computed second initial value; d) comparing the second test length with the first minimum test length, and obtaining a second minimum test length by regarding the first minimum test length as the second minimum test length when the second test length is equal to or longer than the first minimum test length, or by performing a reverse-order fault simulation against the second fault simulation when the second test length is shorter than the first minimum test length; and e) obtaining the shortest test length by repeating the steps b), c), and d) by regarding the second initial value, the second test length, and the second minimum test length as the first initial value, the first test length, and the first minimum test length, wherein an initial value that yields the shortest test length obtained in the step e) is determined as the initial value to be input to the test pattern generator when testing the integrated circuit.

According to the method of the invention having the above-described first configuration, the value that can detect the predetermined number of faults in the shortest time can be selected as the initial value to be input to the test pattern generator. By selecting this value as the initial value for the test pattern generator when testing an integrated circuit, the test time can be greatly reduced compared with the case where no special consideration is paid to the selection of the initial value, and the invention thus offers an enormous effect in reducing the mass production cost.

To solve the above-described problem, the present invention further provides a method for determining an optimum initial value to be input to a test pattern generator for testing an integrated circuit, comprising the steps of: a) obtaining a first number, n, of faults detected with a predetermined target test length $L_{fix}$, by performing a first fault simulation using an arbitrarily given first initial value; b) obtaining a first minimum test length necessary for detecting the first number, n, of faults, by performing a reverse-order simulation against the first fault simulation; c) computing, based on the first initial value and on the target test length $L_{fix}$ and the first minimum test length, a second initial value that yields the first minimum test length; d) obtaining a second number, nt, of faults detected with the predetermined target test length $L_{fix}$, by performing a second fault simulation using the computed second initial value; e) comparing the second number nt with the first number n, and obtaining a maximum number of detected faults by taking the first number n as the maximum number when nt≦n, or by repeating the steps b) to d) until nt≦n is achieved, when nt>n; f) obtaining a test length L necessary for detecting the maximum number of detected faults, by performing a third fault simulation using an initial value, in a test pattern sequence, that immediately follows the initial value that achieves the maximum number of detected faults; g) comparing the test length L with the target test length $L_{fix}$, and, if L≦$L_{fix}$, then computing, based on the initial value used in the third fault simulation and on the test length L and the target test length $L_{fix}$, the next initial value that is likely to yield a test length shorter than the target test length $L_{fix}$; h) repeating the steps f) and g) with the initial value computed in the step g), until L<$L_{fix}$ is achieved; and i) obtaining the largest number of faults detected with the target test length, by repeating the steps a) to h) by regarding as the first initial value the initial value that achieves L<$L_{fix}$ in the step g) or the step h), wherein an initial value that achieves the largest number of detected faults obtained in the step i) is determined as the initial value to be input to the test pattern generator when testing the integrated circuit.

According to the method of the invention having the above-described second configuration, the value that can detect the largest number of faults within the predetermined test length can be selected as the initial value to be input to the test pattern generator. By selecting this value as the initial value for the test pattern generator when testing an integrated circuit, the test quality can be greatly improved compared with the case where no special consideration is paid to the selection of the initial value, and the invention thus offers an enormous effect in reducing the mass production cost.

BRIEF DESCRIPTION OF THE DRAWINGS

FIG. 7 is a diagram showing one example of a program implementing the one embodiment of the present invention;

FIG. 12 is a diagram showing one example of a program implementing another embodiment of the present invention;

FIG. 15 is a diagram for explaining the flowchart shown in FIGS. 13 and 14.

DESCRIPTION OF THE PREFERRED EMBODIMENTS

The preferred embodiments of the present invention will be described below with reference to the accompanying drawings.

Figure 1:
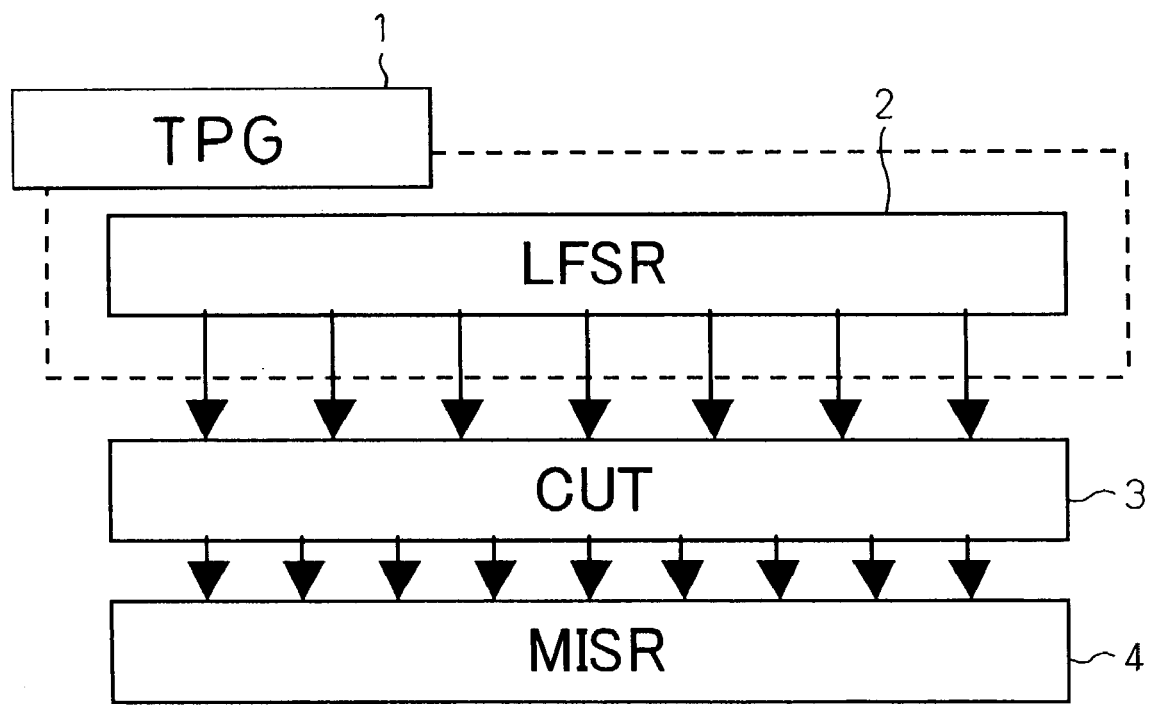
FIG. 1 is a diagram showing a test-per-clock BIST structure.

A test pattern generator that uses an LFSR as a pseudo-random pattern generator generates a test pattern sequence when a clock is applied to it after its initial state has been set up. An example of BIST using such a test pattern generator is a test-per-clock structure such as shown in FIG. 1. In FIG. 1, reference numeral 1 is a test pattern generator constructed from an LFSR 2, 3 is a circuit-under-test (CUT) to which a test pattern is input, and 4 is a test response compactor. Once the state of each flip-flop in the LFSR 2 is determined, the test pattern sequence to be output thereafter is uniquely determined. Information that determines the states of the flip-flops in the LFSR 2 is called a seed.

In the test-per-clock BIST structure that uses an LFSR as the test pattern generator 1, the seed that is input to the LFSR 2 is the same as the test pattern that is output from the LFSR 2 and applied to the CUT 3.

Consider a single stuck-at fault test using an LFSR such as shown in FIG. 1. The circuit to be tested for single stuck-at faults is a combinational circuit.

The LFSR constructed with an m-degree primitive polynomial outputs $(2^m-1)$ different test patterns to the CUT. An m-bit two-element vector from the LFSR can be regarded as an element $\alpha^i$ $(0 \leq i \leq 2^{m-1}-2)$ over a GF $(2^m)$. Here, i denotes an index.

For a seed $\alpha^0$, the LFSR first outputs a test pattern $\alpha^0$, followed by a test pattern $\alpha^1$, and then $\alpha^2$, $\alpha^3$, and so on. For a seed $\alpha^1$, first the test pattern $\alpha^1$. is output, then $\alpha^2$, and so on. The j-th test pattern output in response to the seed $\alpha^i$ is denoted by $\alpha^{1+j-1}$.

Here, let F denote a set of detectable single stuck-at faults that can exist in the CUT. When the fault coverage of a test pattern is expressed as C %, then faults the number of which is given by

|F|×C/100 are detected. Here, ‖ indicates the number of elements in the set.

$F^a$ is a set of faults detected with the test pattern a from among the faults contained in F.

The method of generating the test patterns $\alpha^{i-1}$, $\alpha^{i-2}$, ... for the seed $\alpha^i$ will hereinafter be referred to as reverse-order test pattern generation. $L(\alpha^i, n_{fix})$ is a function that returns the test length that achieves the target fault detection count=$n_t$ for the seed $\alpha^i$. Ideally, $n_{fix}$=|F|, but it is realistic to set a value slightly smaller than |F| as $n_{fix}$.

$L_R(\alpha^{i+1}, n_{fix})$ is a function that returns the test length that achieves the target fault detection count nt when the reverse-order test pattern generation is performed with the seed $\alpha^{i+1}$. $L(\alpha^i, n_{fix})$ and $L_R(\alpha^{i+1}, n_{fix})$ can be obtained through fault simulation.

When a CUT, its target fault detection count $n_{fix}$, and an LFSR polynomial are given, the LFSR seed that minimizes the test length is called the shortest test length seed $\alpha_{i*}$. At this time, i*=arg min$\{L(\alpha^i, n_{fix})\}$.

Next, the relationship between the seed and the test pattern sequence output from the LFSR will be considered.

Figure 2:
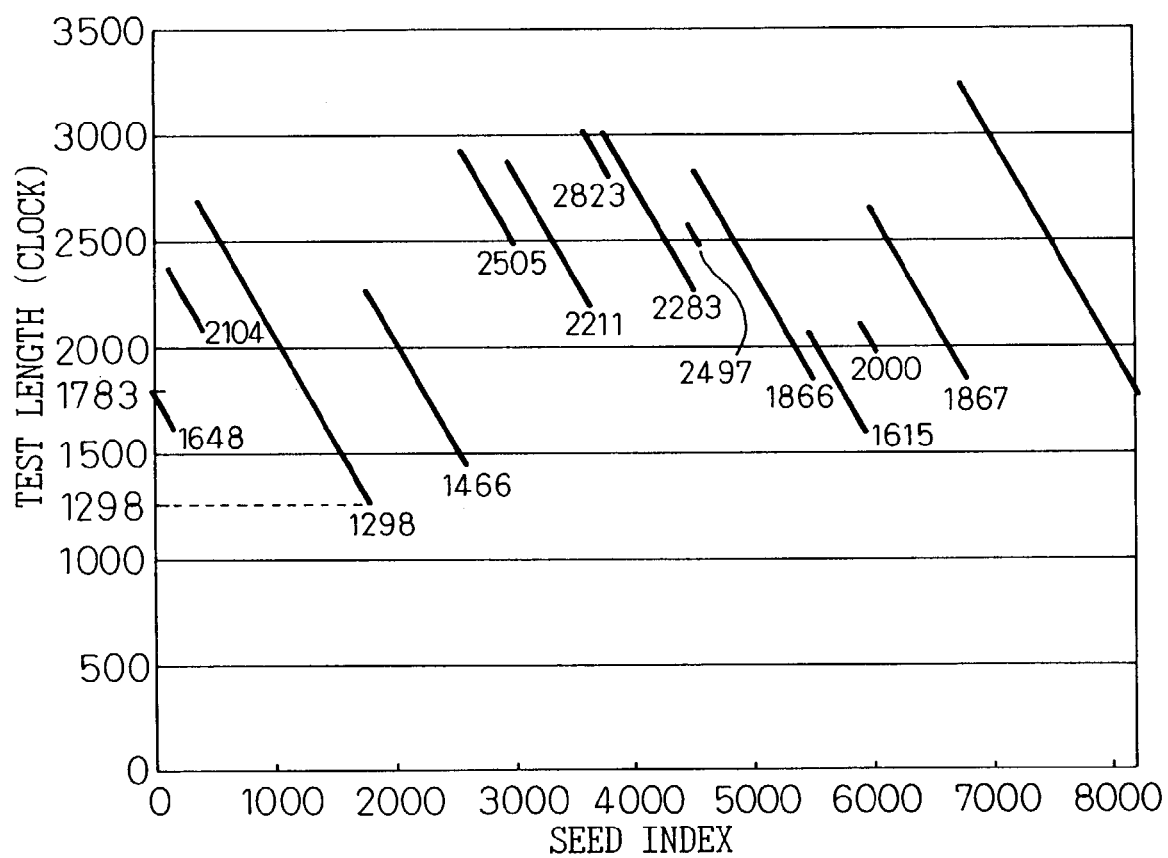
FIG. 2 is a diagram showing the relationship between seed index and test length.

Consider the case where test-per-clock testing is applied to the combinational circuit portion of the s386 circuit which is one of the ISCAS 89 benchmark circuits. The input of this circuit is 13 bits wide. The results of the experiment for the test lengths that achieve 100% fault coverage for each seed are shown in FIG. 2. The number of detectable faults in the s386 circuit is 384. The seed number is plotted as abscissa, and the test length (clock) that achieves 100% fault coverage is plotted as ordinate. From FIG. 2, it can be seen that the test length L that achieves 100% fault coverage for seed $\alpha^0$ is $L(\alpha^0, 384)=1783$.

From FIG. 2, the seed versus test length characteristic of the test-per-clock structure using the LFSR can be identified. That is, each time the index increases by one, the test length either 1) becomes shorter by one, or
2) remains the same, or
3) becomes longer.

Figure 3:
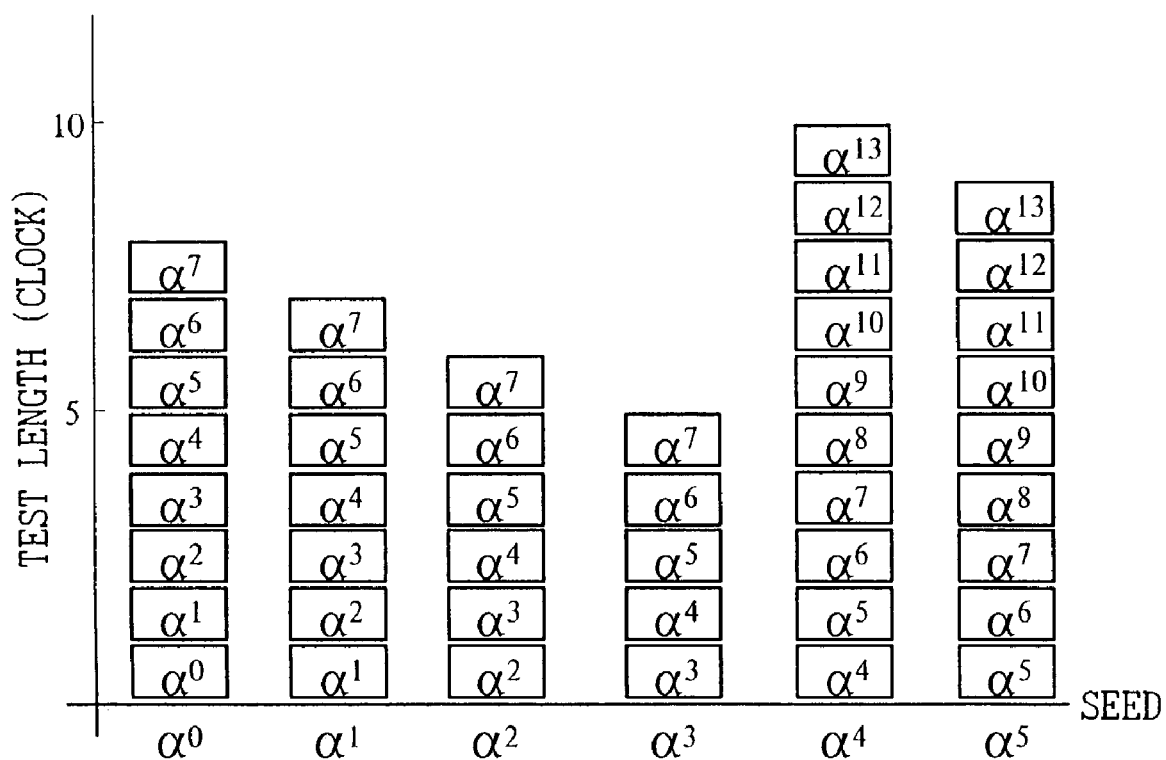
FIG. 3 is a diagram showing in simplified form the relationship between seed index and test length in FIG. 2.

To facilitate understanding of this characteristic, a simplified example of FIG. 2 is shown in FIG. 3. In FIG. 3, the ordinate represents the test length L that achieves 100% fault coverage, and the abscissa represents the seed index i. For simplicity, in FIG. 3 the number of detectable faults in the CUT is assumed to be 100.

From FIG. 3, it can be seen that the test length for seed $\alpha^0$ is $L(\alpha^0, 100)=8$. Next, it is assumed that all the faults detected by $\alpha^0$ have been detected by the seven patterns $\alpha^1$ to $\alpha^7$ generated with the seed $\alpha^1$. That is, $$|F_{a^1} \cup F_{a^2} \cup \ldots \cup F_{a^7}| = |F_{a^0} \cup F_{a^1} \cup \ldots \cup F_{a^7}| = |F|$$

Then, $L(\alpha^1, 100)=7$.

Likewise, when the faults detected by six patterns $\alpha^2$ to $\alpha^7$ contain all the faults detected by $\alpha^1$, that is, $$|F_{a^0} \cup F_{a^1} \cup \ldots \cup F_{a^7}| = |F_{a^1} \cup F_{a^2} \cup \ldots \cup F_{a^7}| = |F|$$

then the test length for seed $\alpha^2$ is $L(\alpha^2, 100)=6$. Similarly, the test length for seed $\alpha^3$ is $L(\alpha^3, 100)=5$.

On the other hand, it is assumed that the faults detected by the patterns $\alpha^4$ to $\alpha^7$ generated with seed $\alpha^4$ are less than 100 in number and thus do not contain all the faults detected by the seed $\alpha^3$. That is $$|F_{a^4} \cup F_{a^5} \cup \ldots \cup F_{a^7}| < |F_{a^3} \cup F_{a^4} \cup \ldots \cup F_{a^7}| = |F|$$

In this case, the test length for seed $\alpha^4$ increases to the point where all the faults detected by the seed $\alpha^3$ are detected. In the example of FIG. 3, the test length increases from 5 to 10.

Here, when the relation $$L(\alpha^i, n_{fix}) < L_R(\alpha^{i+1}, n_{fix})$$

holds, $\alpha^i$ is called the minimum test length seed, and $L(\alpha^i, n_{fix})$ the minimum test length. Hereinafter, the seed that yields the minimum test length is expressed as the minimum test length seed $\alpha^{imin}$, and the index of the seed is denoted by $i_{min}$. Of the minimum test lengths found by performing tests with all the indexes, the smallest one is taken as the shortest test length Ls.

In the example of FIG. 3, the minimum test length seed is $\alpha^3$ and, at this time, the minimum test length is 5. In the example of FIG. 2, there are 13 minimum test lengths, which are, from left to right, 1648, 2104, 1298, 1466, 2505, 2211, 2823, 2283, 2497, 1866, 1615, 2000, and 1867; thus, the shortest test length Ls is 1298.

When the seed that yields the shortest test length L obtained as described above is selected as the initial seed for the LFSR 2 in the circuit of FIG. 1, the testing of the CUT 3 will be completed in the shortest time. On the other hand, in the testing of the CUT 3, if an arbitrary seed is selected without paying any special attention to the seed selection, as in the prior art method, there is the possibility that a seed that yields a test length exceeding 3000, for example, may be selected in the example of FIG. 2. If such a seed is selected, the time required for testing in the mass production of VLSIs becomes enormously long, resulting in an increase in test cost. Accordingly, selecting the seed yielding the shortest test length greatly contributes to reducing the test cost during the mass production of VLSIs.

In reality, however, obtaining the test lengths for all the seeds for test pattern sequences, as shown in FIG. 2, is practically impossible because the circuit scale of a VLSI is very large. There is, therefore, a need for an efficient and practicable method for selecting an optimum seed.

Utilizing the characteristic of the seed versus test length relationship described above, the present invention provides a method for selecting an optimum initial value by using a practically feasible method.

A procedure for selecting the initial seed for obtaining a preset number of faults, $n_{fix}$, with the shortest test length according to the method of the present invention will be described below with reference to drawings. The seed selection in this case is called the shortest test length seed selection method.

First, the selection method of the invention will be described by dividing the procedure into Step A for finding a minimum test length and Step B for checking the presence or absence of a shorter minimum test length. In the following description, i indicates the current index, and i is initialized to 0. That is, the process begins with the seed of index 0.

[Step A]

In Step A, the minimum test length and its seed are obtained.

With the index i and higher, the minimum test length that appears the earliest is obtained. First, the test length $Li(\alpha^i, n_{fix})$ for seed $\alpha^i$ is obtained through fault simulation. Next, fault simulation using the reverse-order test pattern generation is performed to obtain $L_R i(\alpha^{i+Li-1}, n_{fix})$. The minimum test length Lm is thus obtained. The index im that yields the minimum test length is obtained by subtracting the minimum test length Lm from the test length Li and adding i to the difference, that is, Li−Lm+i.

Figure 4:
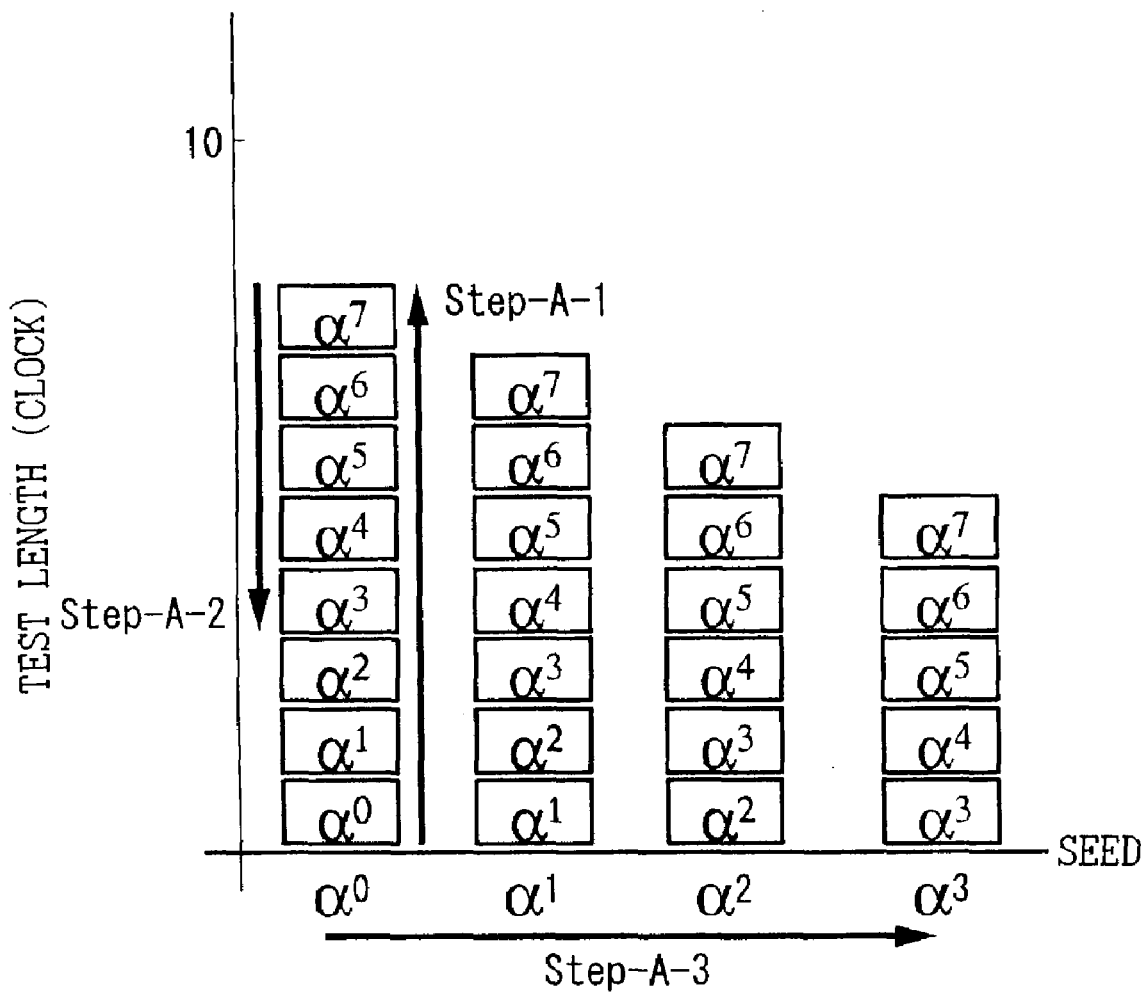
FIG. 4 is a diagram for explaining a method according to one embodiment of the present invention.

FIG. 4 shows an example of Step A. First, in Step-A-1, fault simulation is performed with seed $\alpha^0$ to obtain the test length $(\alpha^0, n_{fix})$. In the example FIG. 4, the test length $L(\alpha^0, n_{fix})=8$. Next, in Step-A-2, by using as the initial seed the seed $\alpha^7$ that achieved the maximum fault detection count $n_{fix}$, reverse-order fault simulation is performed to obtain the test length $L_R(\alpha^7, n_{fix})$. This value gives the minimum test length Lm. In the example of FIG. 4, Lm=5.

The index im that achieves this minimum test length Lm is L−Lm+1=8−5+0=3. This calculation step is Step-A-3. Thus, it can be seen that the seed $\alpha^{Lm-Lm+i}$, that is, $\alpha^3$, is the seed that achieves the target fault coverage with the minimum test length 5.

[Step B]

In Step B, it is checked whether there is a seed that achieves a minimum test length shorter than the minimum test length obtained in Step A.

The test length for the seed of index $i_{min+}1$ is longer than the minimum test length Lm.

First, with the index set to $i=i_{min}+1$, the test length $l=L(\alpha^i, n_{fix})$ is obtained. From this test length L, the next index that is likely to yield a test length shorter than the minimum test length lm can be calculated. That index is $i+l-l_{min}+1$. This index is set as the new index i. The test length $l=L(\alpha^i, n_{fix})$ for the calculated seed $\alpha_i$ is obtained. If the test length l is shorter than the minimum test length $l_{min}$, the process returns to Step-A to obtain the minimum test length once again. Otherwise, the next index that is likely to yield a test length shorter than the minimum test length $l_{min}$ is calculated once again. This step is repeated until a test length shorter than the minimum test length $l_{min}$ appears. In the case of an m-bit LFSR, this process is repeated until the index reaches $(2^m-1)$. The minimum test length $l_{min}$ when $i=2^m-2$ is the shortest test length l* that achieves the target fault coverage, and $i_{min}$ indicates the index i* of the seed that yields the shortest test length.

The operation in Step B will be described with reference to FIGS. 5 and 6. In both FIGS. 5 and 6, it is assumed that the minimum test length $l_{min}=5$ is already achieved with the seed 3. That is, $i_{min}=3$.

First, a description will be given for the case of FIG. 5. In Step-B-1, the test length $L(\alpha^4, n_{fix})$ for seed $\alpha^4$ is obtained. In the example of FIG. 5, the test length is 10. As the minimum test length $l_{min}=5$, it follows that $L(\alpha^4, n_{fix}), \ldots, L(\alpha^9, n_{fix}) \geq 5$. That is, $\alpha^4$ to $\alpha^9$ are not candidates for minimum test length seeds.

In Step-B-2, the index of the next seed that is likely to yield a test length shorter than $l_{min}$ is obtained. In this case, $i=4+10-5+1=10$, and thus the candidate seed is $\alpha^{10}$. Then, the test length $L(\alpha^{10}, n_{fix})$ for the seed $\alpha^{10}$ is obtained. In the example of FIG. 5, the test length $L=4$. This means that there is the possibility that, by using the seed of index 11, the target fault detection count $n_{fix}$ may be achieved with a shorter test length. In this case, the process returns to Step A to obtain the minimum test length $l_{min}$ once again.

Next, a description will be given for the case of FIG. 6. In operation, Step-B-1 and Step-B-2 are the same as those in FIG. 5. In Step-B-1, the test length $L(\alpha^4, n_{fix})$ for the seed $\alpha^4$ is obtained. In the example of FIG. 6, the test length is 10. Next, in Step-B-2, the index of the seed that is likely to yield a test length shorter than the minimum test length $l_{min}$ obtained in the preceding Step-A is calculated. In FIG. 6, as in the case of FIG. 5, the candidate seed is $\alpha^{10}$. In Step-B-3, the test length $L(\alpha^{10}, n_{fix})$ for the seed $\alpha^{10}$ is obtained. In the example of FIG. 6, $L(\alpha^{10}, n_{fix})=7$. In this case, the process returns to Step-B-2 to repeat the step of obtaining the index of the seed that is likely to yield a test length shorter than the minimum test length $l_{min}$.

FIG. 7 shows one example of a program for finding the shortest test length seed.

Figure 8:
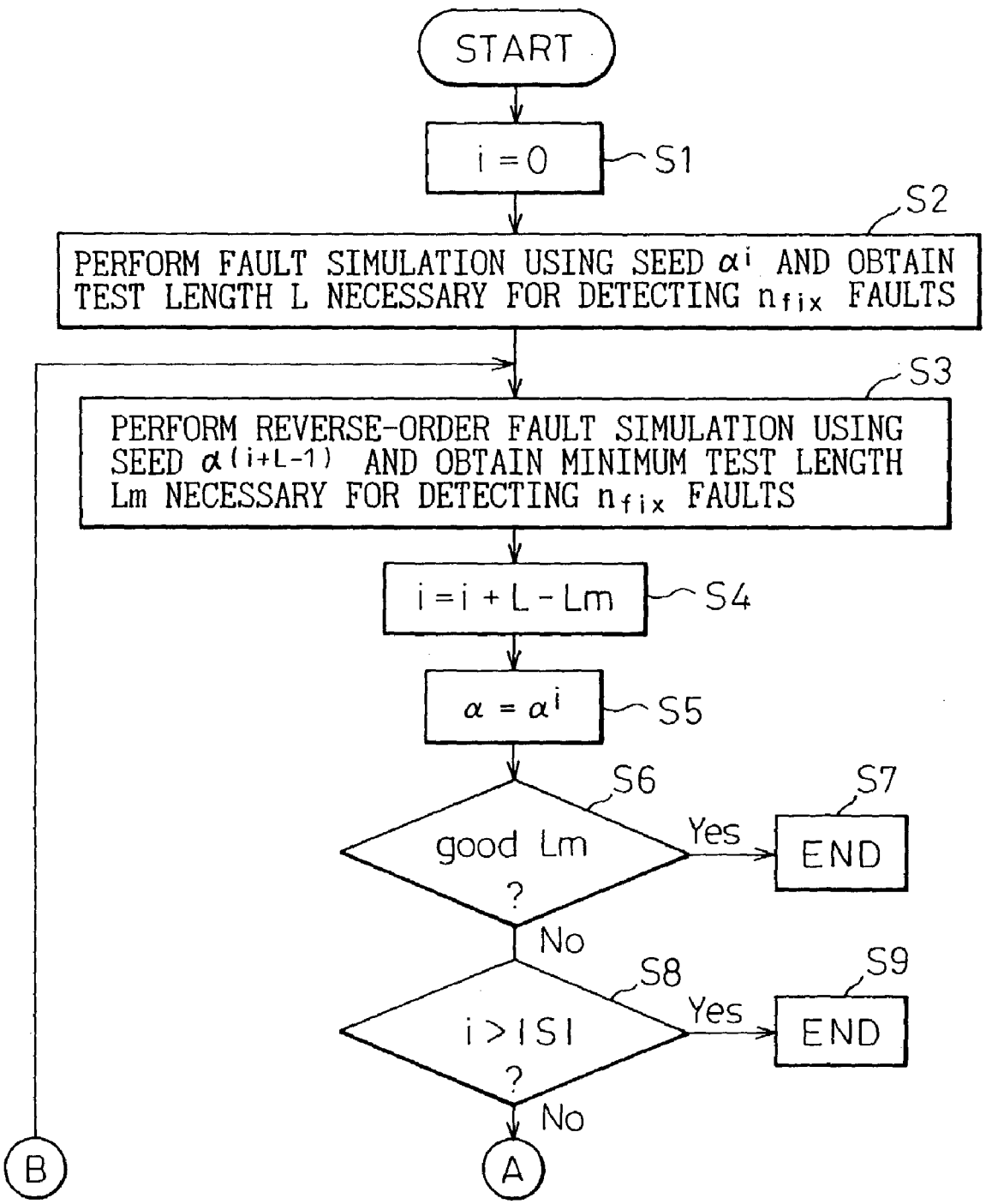
FIG. 8 is a diagram showing the first half of a flowchart illustrating the method steps according to the one embodiment of the present invention.
Figure 9:
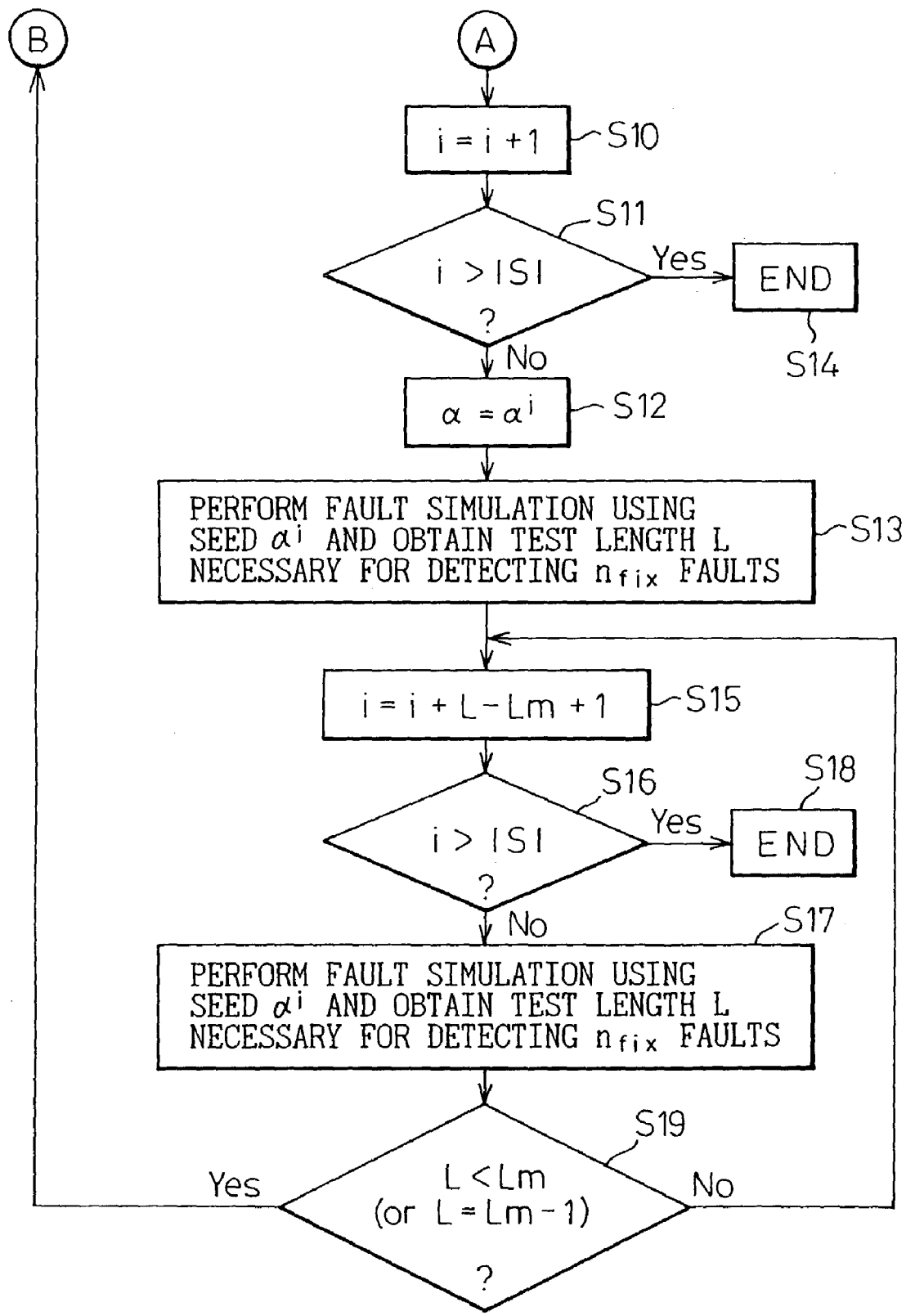
FIG. 9 is a diagram showing the second half of the flowchart, which is a continuation of the flowchart shown in FIG. 8.

A flowchart recapitulating the procedure for finding the shortest test length seed described above is shown in FIGS. 8 and 9. A description will be given below with reference to the flowchart.

First, in step S1, the seed index i is set to 0. Next, in step S2, fault simulation is performed using the seed $\alpha^0$, to obtain the test length L that becomes necessary to detect a predetermined number, $n_{fix}$, of faults. In the example of FIG. 4, the test length L is 8.

In the next step S3, reverse-order fault simulation is performed against the fault simulation performed in step S2, to obtain the minimum test length Lm necessary for obtaining the number, $n_{fix}$, of faults. From the example of FIG. 4, it can be seen that the minimum test length Lm is 5. The initial value i in the reverse-order fault simulation is $i=i+L-1$.

When the minimum test length Lm is obtained in step S3, then the index of the seed that yields the minimum test length Lm is calculated in step S4. In step S5, the seed having the index calculated in step S4 is selected. In step S6, it is determined whether the test length Lm obtained with the seed $\alpha^i$ is a value that is good enough for an integrated circuit test. If the value of Lm is good enough, the process is terminated in step S7, and $\alpha^i$ obtained in step S5 is set as the optimum seed.

Next, in step S8, it is determined whether the index i has reached the final value of the test pattern sequence S. If it has reached the final value (YES in step S8), the process is terminated in step S9, and the seed obtained in step S5 is selected as the optimum value.

Next, in step S10, the index i is incremented by 1, and after confirming in step S11 that the index has not yet reached the final value of the test pattern sequence S, the seed having the index i is selected in step S12, and the same fault simulation as that in step S2 is performed in step S13. In the example of FIG. 5, this fault simulation is performed using the seed $\alpha^4$. If, in step S11, the index i exceeds the final value of the test pattern sequence S (YES in step S11), the process is terminated in step S14, and the seed $\alpha^i$ obtained in step S5 is taken as the optimum value.

With the fault simulation in step S13, the test length L for the seed $\alpha^{i+L-Lm+1}$ is obtained. In the example of FIG. 5, this test length L is 10.

Figure 5:
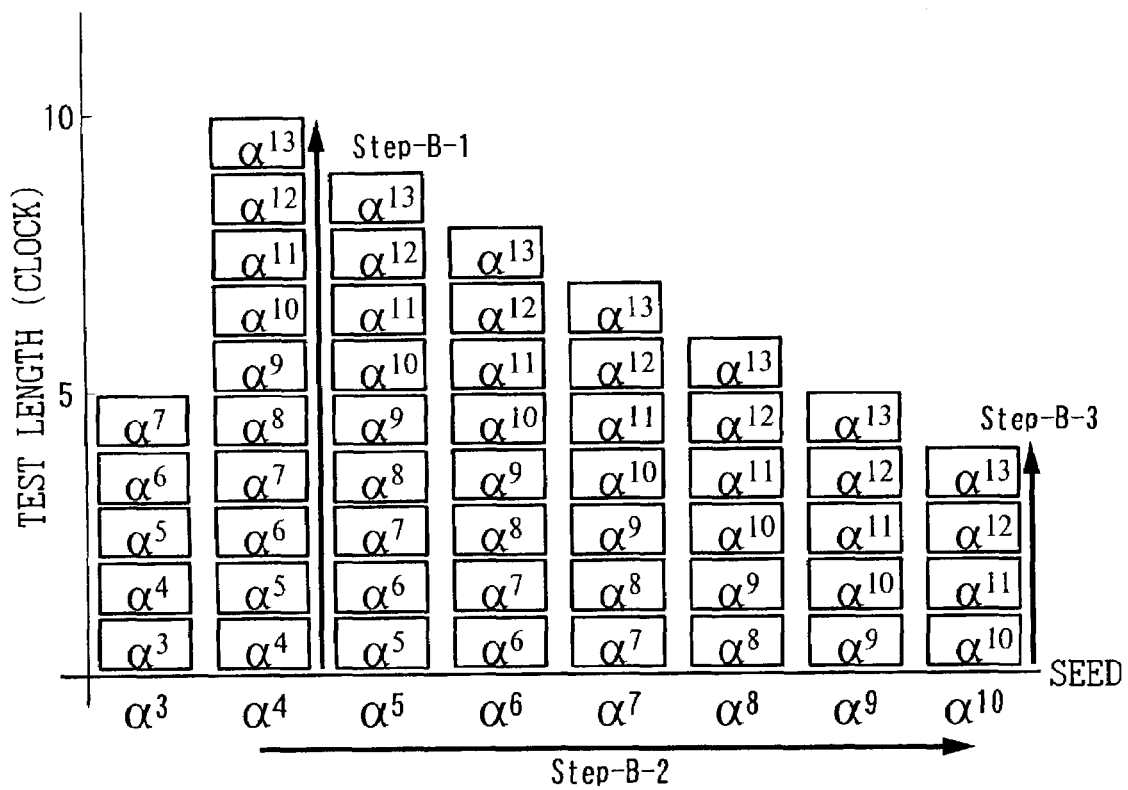
FIG. 5 is a diagram for explaining the method according to the one embodiment of the present invention.

As explained in the description of Step-B-2 in FIG. 5, when the new test length L is obtained in step S13, any seeds from the current index i to the index $i=i+L-Lm$ cannot be candidates for seeds that are likely to yield a test length shorter than the minimum test length Lm. Accordingly, in step S15, the index is incremented to $i=i+L-Lm+1$, and after confirming in step S16 that the index does not exceed the final value of the test pattern sequence S, the same fault simulation as that in step S2 is performed in step S17. If, in step S16, the index i exceeds the final value of the test pattern sequence S, the process is terminated in step S18, and the seed $\alpha^i$ obtained in step S5 is taken as the optimum value.

In the next step S19, it is determined whether the test length L obtained as a result of the fault simulation performed in step S17 is shorter than the minimum test length Lm. As, actually, the test length is decreased by one clock at a time, in step S19 it may be checked whether $L=Lm-1$ or not. If YES is determined in step S19, this corresponds to the example of FIG. 5; therefore, in this case, the process returns to step S3 where the reverse-order fault simulation is performed to obtain a new minimum test length Lm.

Figure 6:
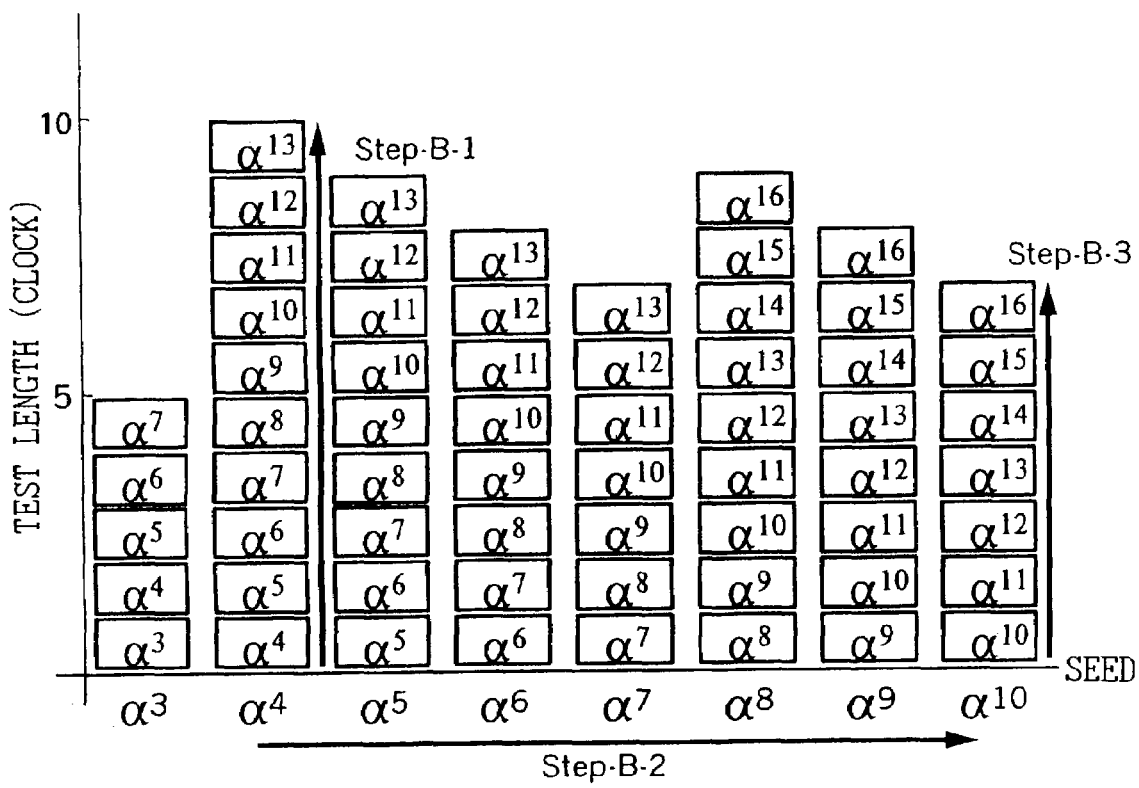
FIG. 6 is a diagram for explaining the method according to the one embodiment of the present invention.

On the other hand, if NO is determined in step S19, this corresponds to the example of FIG. 6; therefore, the process returns to step S15 to calculate the next index that is likely to yield a test length shorter than the minimum test length Lm and, with this index, step S16 and its subsequent steps are repeated. These steps are repeated until the relation L<Lm holds in step S19.

The smallest (shortest) test length Lm is found by repeating the above process.

Alternatively, when the test length L is obtained for the seed $\alpha^4$ in FIG. 5 through fault simulation, reverse-order fault simulation up to the test pattern $\alpha^{10}$ may be performed in this fault simulation to check whether there appears any minimum test length shorter than the previously obtained minimum test length. If a shorter minimum test length is found, then the next seed index that is likely to yield an even shorter test length can be calculated using that value. Using this method, the time required to calculate the shortest test length seed can be further reduced.

Table 1 shows a comparison between the shortest test length seed selection method of the present invention described above and the method that obtains the shortest test length seed by performing fault simulation on all the seeds. The experiment was conducted using the s386 circuit and polynomial 20033. AS can be seen from Table 1, when fault simulation was performed on all the seeds, the fault simulation had to be performed 8191 times, and the calculation time required was about 40 minutes. In contrast, when the method of the present invention was used, the fault simulation need only be performed 14 times, and the calculation time required was about four seconds.

TABLE 1

NUMBER OF TIMES OF FAULT SIMULATION AND CALCULATION TIME IN SHORTEST TEST LENGTH SEED SELECTION METHOD (s386/POLYNOMIAL 20033)

| | NUMBER OF TIMES OF FAULT SIMULATION | CALCULATION TIME |
|---|---|---|
| FAULT SIMULATION PERFORMED ON ALL SEEDS | 8191 TIMES | ABOUT 40 MINUTES |

TABLE 1-continued

NUMBER OF TIMES OF FAULT SIMULATION AND
CALCULATION TIME IN SHORTEST TEST LENGTH SEED
SELECTION METHOD (s386/POLYNOMIAL 20033)

| | NUMBER OF TIMES OF FAULT SIMULATION | CALCULATION TIME |
|---|---|---|
| SHORTEST TEST LENGTH SEED SELECTION METHOD | 14 TIMES | ABOUT 4 SECONDS |

Table 2 shows the test length for the shortest test length seed obtained in the experiment of Table 1, as compared with the test lengths obtained without considering the seed selection. As is apparent from Tables 1 and 2, according to the method of the present invention, as the shortest test length seed can be obtained in a very short time, the time required for integrated circuit testing is greatly reduced.

TABLE 2

SHORTEST TEST LENGTH SEED AS COMPARED
WITH TEST LENGTHS OBTAINED WITHOUT
CONSIDERING SEED SELECTION
(s386/POLYNOMIAL 20033)

| SEED | TEST LENGTH |
|---|---|
| SHORTEST TEST LENGTH SEED | 1293 |
| 00 . . . 01 | 1783 |
| All 1 | 2230 |
| 0101 . . . | 1971 |
| 1010 . . . | 2949 |
| SHORTEST TEST LENGTH IN RANDOM 14 SELECTIONS | 1706 |

Figure 10:
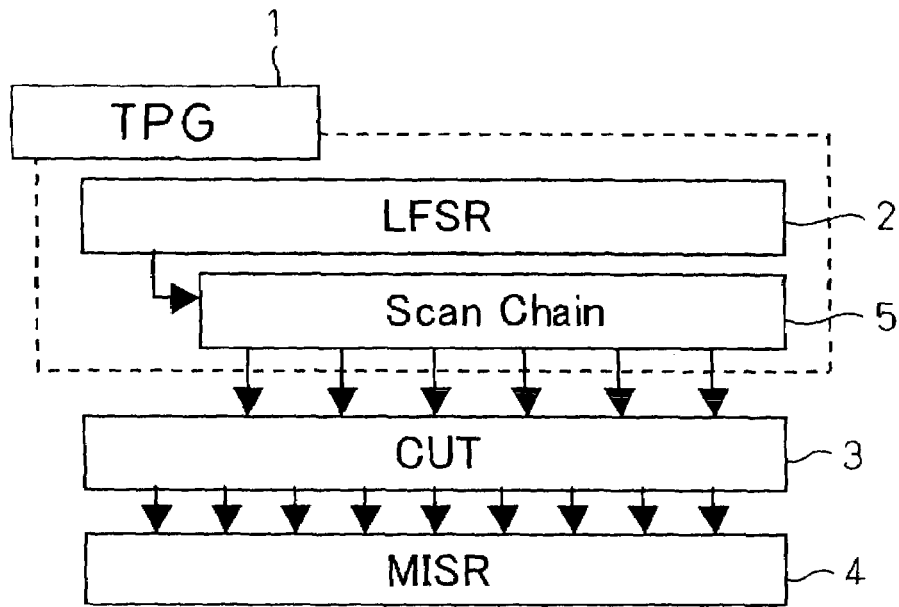
FIG. 10 is a diagram showing a test-per-scan BIST structure.

FIG. 10 is a diagram showing a test-per-scan BIST structure which is different from the test-per-clock BIST structure shown in FIG. 1. The BIST shown here is characterized in that the test pattern generator 1 is constructed using an LFSR 2 in combination with a scan chain 5. According to the structure shown here, since the number of signal inputs to the circuit-under-test (CUT) 3 and the number of bits in the LFSR 2 are independent of each other, the advantage is that a highly integrated circuit can be tested using an LFSR 2 with a smaller number of bits. For example, a circuit with a 1000-bit input can be tested using a 20-bit LFSR.

The test-per-scan structure of FIG. 10 can also change the output test pattern sequence by changing the seed. However, in this structure, the LFSR seed does not appear directly as the test pattern, but here also, the output test pattern sequence is determined by the seed. When the number of stages in the LFSR is m, and the length of the scan chain 5 is k bits, the PRPG outputs k-bit test patterns $p_0$, $p_1$, and so on.

Let $\beta_j$ denote the seed that generates the test pattern $p_j$ after setting the seed in the LFSR. Here, the seed is expressed as $\beta_j = \alpha^{(j \times k) \mod (2^m - 1)}$. That is, $\beta_0 = \alpha^0$, $\beta_1 = \alpha^k$, $\beta_2 = \alpha^{2k}$, and so on. At this time, both of k and $(2^m-1)$ must be prime numbers. If they are not prime numbers, dummy flip-flops are added to the scan chain so that they become prime numbers.

Figure 11:
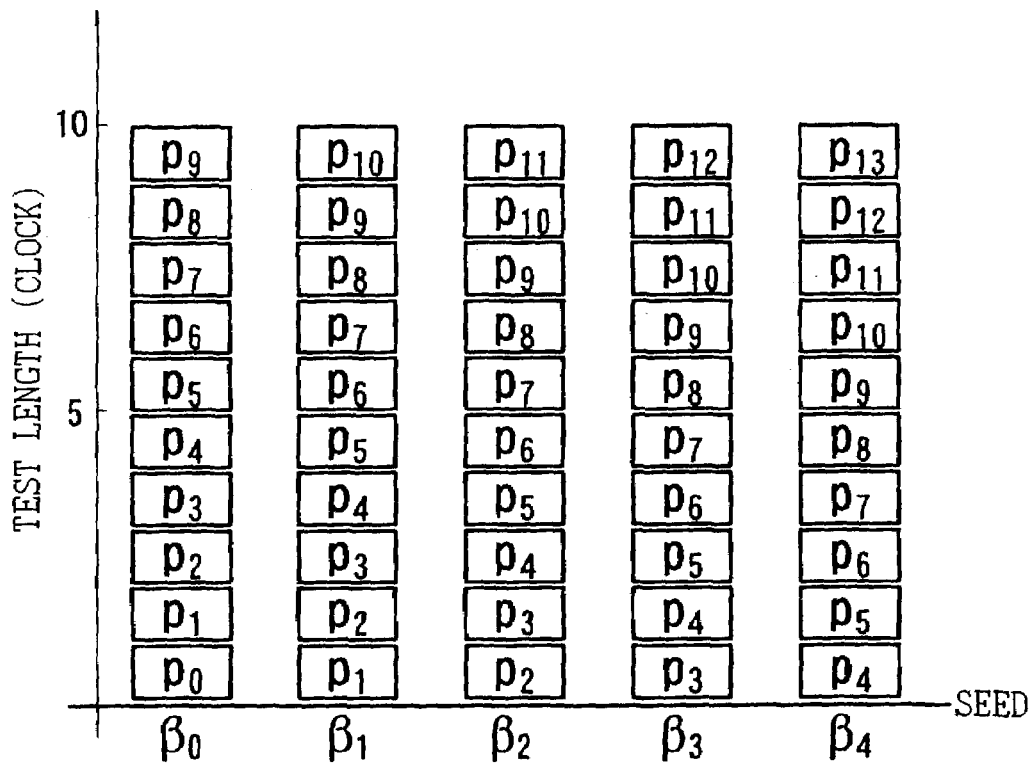
FIG. 11 is a diagram showing the relationship between seed and test pattern in the test-per-scan BIST structure.

The example of FIG. 11 shows that the seeds $\beta_0$ . . . , $\beta_4$ each output 10 test patterns. For example, the seed $\beta_0$ first outputs the test pattern $p_0$. Then, it outputs $p_1$. The 10th test pattern that the seed $\beta_0$ outputs is $p_9$. The seed $\beta_1$ first outputs $p_1$, then $p_2$. In this way, the test-per-scan structure shown in FIG. 10 can obtain the shortest test length that achieves the target fault coverage, by using the same technique as used in the test-per-clock structure of FIG. 1.

A second embodiment of the present invention will be described below. This embodiment concerns an optimum seed selection method that can detect a maximum number of faults within a fixed test time. In the case of a complex circuit, it is difficult to achieve a fault coverage exceeding 95%, and it is realistic to set a certain test length and select a seed that can detect the largest number of faults with that test length $l_{fix}$. This seed $$\beta_{j*} = \underset{\beta_j}{\operatorname{argmax}} |F_{\beta j} \cup F_{\beta j+1} \cup \ldots \cup F_{\beta j+1_{fix}-1}|$$

is called the maximum fault detection count seed.

The maximum fault detection count seed selection method is an extension of the shortest test length seed selection method described above. The difference from the shortest test length seed selection method is that the selection method of this embodiment dynamically updates the target fault detection count each time a minimum test length is found.

Before describing this method, the function will be defined. $D(\alpha^i, 1)$ is a function that returns the number of faults detected with the test length l for the seed $\alpha^i$. Like $L(\alpha^i, n_{fix})$ and $L_R(\alpha_{i+1}, n_{fix})$, $D(\alpha^i, 1)$ can be obtained through fault simulation.

When the test length $l_{fix}$ is given, the seed that achieves the largest fault detection count with that test length is selected. The process consists of two steps, Step-A* for obtaining the target fault detection count for the given test length $l_{fix}$ and Step-B* for predicting the presence of a seed that can detect a larger number of faults.

The seed number of $\beta_j$ is denoted by j. As the selection process starts with the seed of the seed number 0, j=0.

In Step-A*, the target fault detection count for the test length $l_{fix}$ is obtained.

First, the number of faults detected with the test length $l_{fix}$ corresponding to the seed $\beta_j$ is set as the target fault detection count nt. That is, nt=$D(\beta_j, l_{fix})$. Next, the minimum test length that achieves the target fault detection count nt is obtained from $$L_R(\beta_{i+l_{fix}-l}, n_t)$$

The minimum test length $l_{min}$ is thus obtained. The seed number $j_{min}$ that yields the minimum test length is $j_{min} = j + l_{fix} - l_{min}$. With this $j_{min}$, Step-A* is repeated until the test length of seed $\beta_{imin+1}$ becomes longer than $l_{fix}$.

When the test length of seed $\beta_{imin+1}$ is longer than the target test length $l_{fix}$, the process proceeds to Step-B*. The seed number at which the test length $l = L_F(\beta_j, n_{fix})$ that achieves the target fault detection count $n_{fix}$ becomes shorter than $l_{fix}$ is calculated. The prediction is repeated until l becomes equal to the calculated test length $l_{fix}-1$ and, when the predicted test length is achieved, the target fault detection count $n_t$ is again set.

In the case of an m-bit LFSR, this process is repeated until the seed number reaches $2^m-2$. The thus obtained target fault detection count nt is the maximum fault detection count n* for a given test length $l_{fix}$, and the seed number $j_{min}$ is the maximum fault detection count seed number j*.

FIG. 12 shows one example of a program for finding the maximum fault detection count seed.

Figure 13:
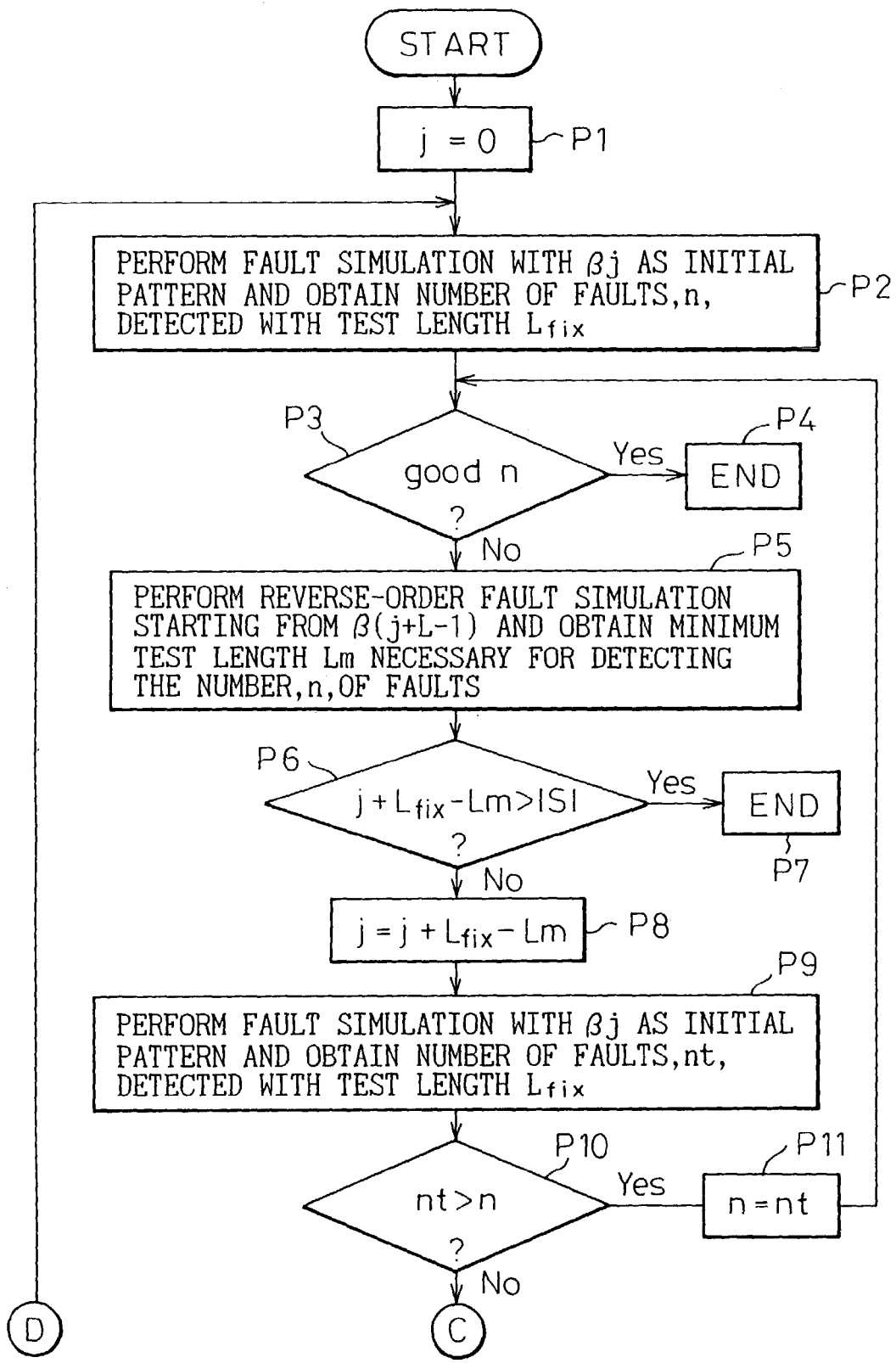
FIG. 13 is a diagram showing the first half of a flowchart illustrating the method steps according to that other embodiment of the present invention.
Figure 14:
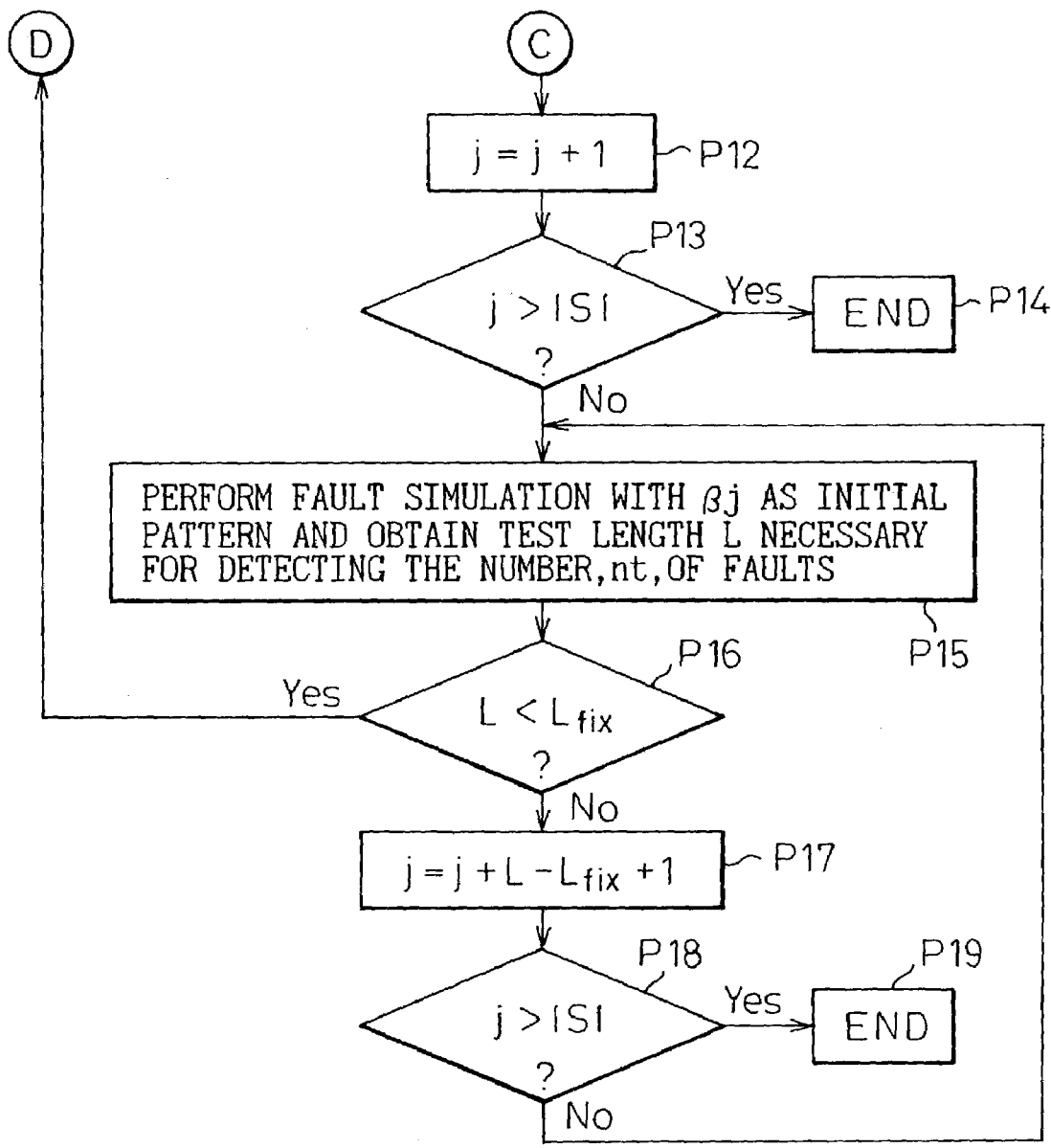
FIG. 14 is a diagram showing the second half of the flowchart, which is a continuation of the flowchart shown in FIG. 13.

FIGS. 13 and 14 show a flowchart recapitulating the procedure for finding the maximum fault detection count seed described above. FIG. 15 is a diagram for explaining the flowchart. The second embodiment of the present invention will be described below with reference to these drawings.

First, in step P1, the seed number J is set to 0. Next, in step P2, fault simulation is performed with the seed β0 of the seed number 0, to obtain the number of faults, n, detected with a predetermined test length $L_{fix}$ (in the example of FIG. 15, $L_{fix}$=10).

In step P3, it is determined whether the value of n obtained in step P2 satisfies the condition as the maximum fault count. If the condition is satisfied, the process is terminated in step P4, and the seed β0 that achieves the maximum fault count n is set as the initial value to be input to the test pattern generator.

If NO in step P3, the process proceeds to step P5 where reverse-order fault simulation is performed against the fault simulation performed in step P2, to obtain the minimum test length Lm necessary for detecting the number, n, of faults. In the example of FIG. 15, the minimum test length Lm is 7. The seed number that yields this minimum test length is calculated as $J+L_{fix}-Lm$. In step P6, it is determined whether the seed number $J+L_{fix}-Lm$ exceeds the final value of the test pattern sequence S. If the determination is YES, the process is terminated in step P7, and the more recently obtained seed that yields the minimum test length is selected as the optimum initial value.

If, in step P6, the seed number $J+L_{fix}-Lm$ is within the range of the test pattern sequence S (NO in step P6), then in step P8 the seed number J is set to $J+L_{fix}-Lm$ and, in step P9, fault simulation is performed using this seed number, to find how many faults are detected within the target test length $L_{fix}$. This is because, in the case of a seed that yields the minimum test length Lm here, unlike the case of the shortest test length seed detection method, there is the possibility that a new fault may be found between the minimum test length Lm and the target test length $L_{fix}$.

In the case of FIG. 15, if fault simulation is performed with the seed $\alpha^3$ by giving the test length 10, there is the possibility that a new fault may be found with the test patterns p10 to p12.

In the next step P10, the fault count nt obtained in step P9 is compared with the fault count n obtained in step P2. If nt>n, n is set as nt in step P11, after which the process returns through step P3 to step P5 where the reverse-order fault simulation is performed once again to obtain the minimum test length necessary for detecting the number, nt, of faults. Then, step P6 and subsequent steps are carried out to obtain a new fault count nt; this process is repeated until nt≧t.

When, with the above processing, the number, n, of faults detected with the target test length $L_{fix}$ reaches a maximum and the fault count is no longer updated, the seed number of the seed that achieves the maximum fault count is incremented by 1 in step P12. In the example of FIG. 15, when the number, nt, of faults detected with the seed β3 is nt≦st, the next seed is β4. In step P13, it is determined whether this seed number exceeds the final value of the test pattern sequence; if it exceeds the final number, the process is terminated in step p14, otherwise the process proceeds to step P15.

In step P15, fault simulation is performed with the seed of the new number to obtain the test length L necessary for achieving the so-far obtained maximum fault count n and, in step P16, this test length L is compared with the target test length $L_{fix}$. In the case of FIG. 15, as the test length L of the seed β4 is 13, L>$L_{fix}$. In this case, as can be seen from FIG. 15, there is the possibility that the seed β8 is likely to yield a test length L shorter than $L_{fix}$. In step P17, the next seed number that is likely to yield a test length L shorter than $L_{fix}$ is computed.

In step P18, it is determined whether the seed number computed in step P17 exceeds the final value of the test pattern sequence; if it does not exceed the final value, the process returns to step P15 to perform fault simulation with the seed of the above-computed seed number. This step is repeated until the test length L becomes shorter than $L_{fix}$ in step P16. If YES in step P18, as in steps P7 and P13, the process is terminated in step P19.

When the test length L becomes shorter than $L_{fix}$ in step P16, steps P2 and subsequent steps are carried out using the seed obtained here, to obtain a new fault count detected within the target test length $L_{fix}$. In this way, the maximum fault detection count is obtained by repeating the above process until the thus obtained new fault count reaches the predetermined target fault count or until the seed number exceeds the final value of the test pattern sequence. The seed determined here is the optimum initial value for the test pattern generator.

Alternatively, when the test length L is obtained for the seed β4 in FIG. 15 through fault simulation (step P15 in FIG. 14), reverse-order fault simulation up to the test pattern p14 may be performed in this fault simulation to check whether there appears any minimum test length shorter than the previously obtained minimum test length. If a shorter minimum test length is found, then the next seed number that can detect a larger number of faults within the target test length $L_{fix}$ can be calculated using that value. Using this method, the time required to calculate the maximum fault detection count seed can be further reduced.

The above maximum fault detection count seed selection method has been described for the test-per-scan structure shown in FIGS. 10 and 11, but it will be appreciated that the above selection method can be equally applied to the test-per-clock BIST structure.

Table 3 shows a comparison between the seed $\alpha_0$ and the maximum fault detection count seed obtained by the method of the present invention, for 20 polynomials in the c7552 circuit using a 20-bit primitive polynomial LFSR. The table shows the average number of detected faults, the minimum number of undetected faults, and the processing time per polynomial, for the seed $\alpha_0$(00 . . . 01) and the maximum fault detection count seed.

TABLE 3

AVERAGE FAULT DETECTION COUNT FOR c7552 with 20-BIT LFSR/20 POLYNOMIALS

| TEST LENGTH | SEED 00 . . . 01 | | MAXIMUM FAULT DETECTION COUNT SEED | | PROCESSING TIME (SECONDS) |
|---|---|---|---|---|---|
| | AVERAGE NUMBER OF UNDETECTED FAULTS | MINIMUM NUMBER OF UNDETECTED FAULTS | AVERAGE NUMBER OF UNDETECTED FAULTS | MINIMUM NUMBER OF UNDETECTED FAULTS | |
| 1000 | 464 | 418 | 369 | 359 | 4121 |
| 5000 | 351 | 319 | 277 | 259 | 4262 |
| 10000 | 304 | 270 | 243 | 227 | 5034 |

For the target test length 1000, when the seed $\alpha^0$ is used, the average number of undetected faults is 464, and the minimum number of undetected faults is 418. In the case of the maximum fault detection count seed, the average number is 369, and the minimum number of undetected faults is 359. The processing time per polynomial was 4121 seconds.

When the test length is 10000, the number of undetected faults is 227 in the case of the polynomial having the maximum fault detection count seed that achieves the largest fault detection count among the 20 primitive polynomials. This means that 77 more faults are detected compared with the average number of undetected faults, i.e., 304, for the seed $\alpha^0$.

What is claimed is:

1. A method for determining an optimum initial value to be input to a test pattern generator for testing an integrated circuit, comprising the steps of:
   a) obtaining a first test length and a first minimum test length for detecting a predetermined fault number n by performing a fault simulation and a reverse-order fault simulation using an arbitrarily given first initial value;
   b) computing, based on said first initial value and on said first test length and said first minimum test length, a second initial value that can yield a test length shorter than said first minimum test length;
   c) obtaining a second test length for detecting said fault number n by performing a second fault simulation using said computed second initial value;
   d) comparing said second test length with said first minimum test length, and obtaining a second minimum test length by regarding said first minimum test length as said second minimum test length when said second test length is equal to or longer than said first minimum test length, or by performing a reverse-order fault simulation against said second fault simulation when said second test length is shorter than said first minimum test length; and
   e) obtaining the shortest test length by repeating said steps b), c), and d) by regarding said second initial value, said second test length, and said second minimum test length as said first initial value, said first test length, and said first minimum test length, wherein
      an initial value that yields the shortest test length obtained in said step e) is determined as the initial value to be input to said test pattern generator when testing said integrated circuit.

2. A method for determining an optimum initial value for testing an integrated circuit as claimed in claim 1, wherein in said step e), said steps b), c), and d) are repeated until said minimum test length reaches a predetermined value.

3. A method for determining an optimum initial value for a test pattern generator as claimed in claim 1, wherein in said step e), said steps b), c), and d) are repeated until said first or second initial value reaches a final value of a preselected test pattern sequence.

4. A method for determining an optimum initial value for a test pattern generator as claimed in claim 1, wherein when said first initial value is an i-th value in a test pattern sequence, said first test length is L, said first minimum test length is Lm, and said second initial value in said step b) is an i2-th value in said test pattern sequence, then i2 is calculated as $i2=i+L-Lm+1$.

5. A method for determining an optimum initial value for a test pattern generator as claimed in claim 1, wherein said test pattern generator has a test-per-clock structure using a linear feedback shift register.

6. A method for determining an optimum initial value for a test pattern generator as claimed in claim 1, wherein said test pattern generator has a test-per-scan structure using a linear feedback shift register in combination with a scan chain.

7. An apparatus for testing an integrated circuit that is constructed by integrating into a single chip a circuit-under-test, a test pattern generator for generating a test pattern sequence and applying the same to said circuit-under-test, and a test response compactor for detecting a test result from said circuit-under-test, wherein said test pattern generator is provided with an initial value that yields the shortest test length, said shortest test length being determined by performing the steps of:
   a) obtaining a first test length and a first minimum test length for detecting a predetermined fault number n by performing a fault simulation and a reverse-order fault simulation using an arbitrarily given first initial value;
   b) computing, based on said first initial value and on said first test length and said first minimum test length, a second initial value that can yield a test length shorter than said first minimum test length;
   c) obtaining a second test length for detecting said fault number n by performing a second fault simulation using said computed second initial value;
   d) comparing said second test length with said first minimum test length, and obtaining a second minimum test length by regarding said first minimum test length as said second minimum test length when said second test length is equal to or longer than said first minimum test length, or by performing a reverse-order fault simulation against said second fault simulation when said second test length is shorter than said first minimum test length; and e) obtaining said shortest test length by repeating said steps b), c), and d) by regarding said second initial value, said second test length, and said second minimum test length as said first initial value, said first test length, and said first minimum test length.

8. An apparatus for testing an integrated circuit as claimed in claim 7, wherein said test pattern generator has a test-per-clock structure using a linear feedback shift register.

9. An apparatus for testing an integrated circuit as claimed in claim 7, wherein said test pattern generator has a test-per-scan structure using a linear feedback shift register in combination with a scan chain.

10. A method for determining an optimum initial value to be input to a test pattern generator for testing an integrated circuit, comprising the steps of:

a) obtaining a first fault number n detected with a predetermined target test length $L_{fix}$, by performing a first fault simulation using an arbitrarily given first initial value;

b) obtaining a first minimum test length necessary for detecting said first fault number n by performing a reverse-order simulation against said first fault simulation;

c) computing, based on said first initial value and on said target test length $L_{fix}$ and said first minimum test length, a second initial value that yields said first minimum test length;

d) obtaining a second fault number nt detected with said predetermined target test length $L_{fix}$, by performing a second fault simulation using said computed second initial value;

e) comparing said second fault number nt with said first number n, and obtaining a maximum number of detected faults by taking said first fault number n as said maximum number when nt≦n, or by repeating said steps b) to d) until nt≦n is achieved, when nt>n;

f) obtaining a test length L necessary for detecting said maximum number of detected faults, by performing a third fault simulation using an initial value, in a test pattern sequence, that immediately follows the initial value that achieves said maximum number of detected faults;

g) comparing said test length L with said target test length $L_{fix}$ and, if $L \geq L_{fix}$, then computing, based on the initial value used in said third fault simulation and on said test length L and said target test length $L_{fix}$, the next initial value that is likely to yield a test length shorter than said target test length $L_{fix}$;

h) repeating said steps f) and g) with the initial value computed in said step g), until $L < L_{fix}$ is achieved; and i) obtaining the largest number of faults detected with said target test length, by repeating said steps a) to h) by regarding as said first initial value the initial value that achieves $L < L_{fix}$ in said step g) or said step h), wherein an initial value that achieves said largest number of detected faults obtained in said step i) is determined as the initial value to be input to said test pattern generator when testing said integrated circuit.

11. A method for determining an optimum initial value for testing an integrated circuit as claimed in claim 10, wherein in said step i), said steps a) to h) are repeated until the number of faults detected reaches a predetermined desired value.

12. A method for determining an optimum initial value for a test pattern generator as claimed in claim 10, wherein in said step i), said steps a) to h) are repeated until any one of said initial value reaches a final value of a preselected test pattern sequence.

13. A method for determining an optimum initial value for a test pattern generator as claimed in claim 10, wherein when said first initial value is an i-th value in a test pattern sequence, said predetermined target test length is $L_{fix}$, said first minimum test length is Lm, and said second initial value in said step c) is an i2-th value in said test pattern sequence, then i2 is calculated as $$i2 = i + L_{fix} - Lm.$$

14. A method for determining an optimum initial value for a test pattern generator as claimed in claim 10, wherein said test pattern generator has a test-per-clock structure using a linear feedback shift register.

15. A method for determining an optimum initial value for a test pattern generator as claimed in claim 10, wherein said test pattern generator has a test-per-scan structure using a linear feedback shift register in combination with a scan chain.

16. An apparatus for testing an integrated circuit that is constructed by integrating into a single chip a circuit-under-test, a test pattern generator for generating a test pattern sequence and applying the same to said circuit-under-test, and a test response compactor for detecting a test result from said circuit-under-test, wherein said test pattern generator is provided with an initial value that achieves the largest number of detected faults, said largest number of detected faults being determined by performing the steps of:

a) obtaining a first fault number n detected with a predetermined target test length $L_{fix}$, by performing a first fault simulation using an arbitrarily given first initial value;

b) obtaining a first minimum test length necessary for detecting said first fault number n by performing a reverse-order simulation against said first fault simulation;

c) computing, based on said first initial value and on said target test length $L_{fix}$ and said first minimum test length, a second initial value that yields said first minimum test length;

d) obtaining a second fault number nt detected with said predetermined target test length $L_{fix}$, by performing a second fault simulation using said computed second initial value;

e) comparing said second fault number nt with said first fault number n, and obtaining a maximum number of detected faults by taking said first fault number n as said maximum number when nt≦n, or by repeating said steps b) to d) until nt≦n is achieved, when nt>n;

f) obtaining a test length L necessary for detecting said maximum number of detected faults, by performing a third fault simulation using an initial value, in a test pattern sequence, that immediately follows the initial value that achieves said maximum number of detected faults;

g) comparing said test length L with said target test length $L_{fix}$ and, if $L \geq L_{fix}$, then computing, based on the initial value used in said third fault simulation and on said test length L and said target test length $L_{fix}$, the next initial value that is likely to yield a test length shorter than said target test length $L_{fix}$;

h) repeating said steps f) and g) with the initial value computed in said step g), until $L < L_{fix}$ is achieved; and i) obtaining said largest number of faults detected with said target test length, by repeating said steps a) to h) by regarding as said first initial value the initial value that achieves $L<L_{fix}$ in said step g) or said step h).

17. An apparatus for testing an integrated circuit as claimed in claim 16, wherein said test pattern generator has a test-per-clock structure using a linear feedback shift register.

18. An apparatus for testing an integrated circuit as claimed in claim 16, wherein said test pattern generator has a test-per-scan structure using a linear feedback shift register in combination with a scan chain.

* * * * *